United States Patent
Bartolf et al.

(10) Patent No.: US 10,361,082 B2
(45) Date of Patent: Jul. 23, 2019

(54) SEMICONDUCTOR DEVICE AND METHOD FOR MANUFACTURING SUCH A SEMICONDUCTOR DEVICE

(71) Applicant: ABB Schweiz AG, Baden (CH)

(72) Inventors: Holger Bartolf, Brugg (CH); Munaf Rahimo, Gänsbrunnen (CH); Lars Knoll, Wohlenschwil (CH); Andrei Mihaila, Baden (CH); Renato Minamisawa, Windisch (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/997,298

(22) Filed: Jun. 4, 2018

(65) Prior Publication Data

US 2018/0286963 A1    Oct. 4, 2018

Related U.S. Application Data

(63) Continuation of application No. PCT/EP2016/076084, filed on Oct. 28, 2016.

(30) Foreign Application Priority Data

Dec. 2, 2015    (EP) ..................... 15197558

(51) Int. Cl.
H01L 21/266    (2006.01)
H01L 29/66    (2006.01)
(Continued)

(52) U.S. Cl.
CPC .......... H01L 21/266 (2013.01); H01L 21/049 (2013.01); H01L 21/0465 (2013.01);
(Continued)

(58) Field of Classification Search
CPC ................. H01L 21/266; H01L 29/086; H01L 29/66333; H01L 29/66712; H01L 21/0465;
(Continued)

(56) References Cited

U.S. PATENT DOCUMENTS 4,914,047 A  *  4/1990  Seki ................... H01L 21/266
                                                438/138
7,074,643 B2 *  7/2006  Ryu ..................... H01L 21/049
                                                438/105
(Continued)

FOREIGN PATENT DOCUMENTS

JP    2010267762 A    11/2010
JP    2011049267 A    3/2011
WO    2015042146 A1    3/2015

OTHER PUBLICATIONS

European Patent Office, International Search Report & Written Opinion issued in corresponding Application No. PCT/EP2016/076084, dated Dec. 19, 2016, 12 pp.

(Continued)

*Primary Examiner* — Kyoung Lee
(74) *Attorney, Agent, or Firm* — Taft Stettinius & Hollster LLP; J. Bruce Schelkopf (57) ABSTRACT

A method of manufacturing a semiconductor device is provided with: (a) providing a wide bandgap substrate product, (b) for forming two channel layers applying a first mask and applying a p first dopant, for forming two source regions forming a second mask by applying a further layer on the lateral sides of the first mask and applying an n second dopant, for forming two well layers forming a third mask by removing such part of the second mask between the source regions and applying a p third dopant, wherein a well layer depth is at least as large as a channel layer depth, (c) after step (b) for forming a plug applying a fourth mask, which (Continued)

covers the source regions and the channel layers and applying a p fourth dopant to a greater depth than the well layer depth and with a higher doping concentration than the well layers; wherein the well layers surround the plug in the lateral direction and separate it from the two source regions.

20 Claims, 8 Drawing Sheets (51) Int. Cl.
*H01L 29/739* (2006.01)
*H01L 29/78* (2006.01)
*H01L 29/10* (2006.01)
*H01L 29/16* (2006.01)
*H01L 21/04* (2006.01)
*H01L 29/06* (2006.01)
*H01L 29/08* (2006.01)
*H01L 29/36* (2006.01)
*H01L 29/20* (2006.01)

(52) U.S. Cl.
CPC ...... *H01L 21/0485* (2013.01); *H01L 29/0634* (2013.01); *H01L 29/0696* (2013.01); *H01L 29/086* (2013.01); *H01L 29/0821* (2013.01); *H01L 29/0865* (2013.01); *H01L 29/1033* (2013.01); *H01L 29/1095* (2013.01); *H01L 29/1608* (2013.01); *H01L 29/36* (2013.01); *H01L 29/66068* (2013.01); *H01L 29/66333* (2013.01); *H01L 29/66712* (2013.01); *H01L 29/7395* (2013.01); *H01L 29/7802* (2013.01); *H01L 29/7811* (2013.01); *H01L 29/2003* (2013.01)

(58) Field of Classification Search
CPC ............. H01L 21/0485; H01L 29/7811; H01L 29/0634; H01L 29/0696; H01L 29/0821; H01L 21/049; H01L 29/0865; H01L 29/1033; H01L 29/36; H01L 29/1608; H01L 29/1095; H01L 29/7802; H01L 29/7395; H01L 29/66068; H01L 29/2003
See application file for complete search history.

(56) References Cited

U.S. PATENT DOCUMENTS 7,517,807 B1    4/2009  Tucker et al.
2010/0200931 A1 8/2010  Matocha et al.
2012/0205670 A1 8/2012  Kudou et al.

OTHER PUBLICATIONS

European Patent Office, Extended Search Report issued in corresponding Application No. 15197558.8, dated May 4, 2016, 9 pp.

* cited by examiner

SEMICONDUCTOR DEVICE AND METHOD FOR MANUFACTURING SUCH A SEMICONDUCTOR DEVICE

TECHNICAL FIELD

The invention relates to the field of power electronics and more particularly to a method for manufacturing a semiconductor device and to such a semiconductor device.

BACKGROUND ART

Figure 14:
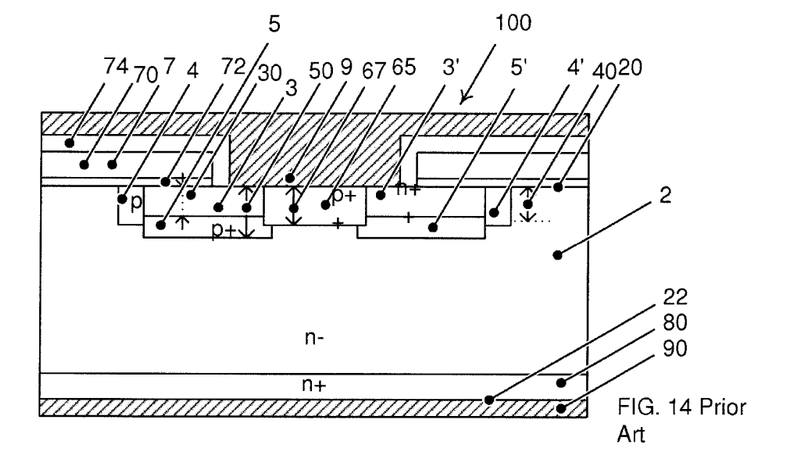
FIG. 14 shows a prior art silicon-carbide MOSFET.

In FIG. 14 a prior art MOSFET 100 is shown as known from U.S. Pat. No. 7,074,643 B2. The prior art MOSFET 100 is made of an n+ silicon carbide (SiC) substrate 80 and comprises between a first main side 20 and a second main side 22 an n− doped drift layer 2. On the first main side 20, two n++ doped source regions 3, 3' are arranged, each which is separated from the drift layer 2 in lateral direction (i.e. in a direction parallel to the first main side 20) by a p doped channel layer 4, 4' and on a side opposite to the first main side 20 by a p+ well layer 5, 5', which is higher doped than the channel layer 4, 4'. In between such two source regions 3, 3' surrounded by a channel layer 4, 4' and a well layer 5, 5', a p++ doped contact layer 65 is arranged, which laterally extends to the source regions. Due to its high doping concentration the p++ doped contact layer provides a good ohmic contact to a first main electrode 9 (source electrode). The contact layer 65 is a shallow layer spatially (i.e. in depth direction, which direction is vertical to the first main side 20) extending to a contact layer depth 67, which is less deep than the well layers 5, 5', but electrically and mechanically contacting the well layers 5, 5' in order to connect the well layers 5, 5' to the source electrode 9. The contact layer 65 overlaps with the source regions 3, 3' and the channel layers 4, 4', so that the contact layer 65 is the only p doped layer in contact with the first main electrode 9.

JP 2010 267762 A describes a MOSFET which comprises on the first main side a highly p doped contact layer and a lower doped well layer below an n source region and a channel layer, which surround the source regions. First the well layer is formed, followed by the channel layer with a new, wide mask. Afterwards the p contact layer is formed with another mask and then the n source regions are formed with a fourth mask. As four different masks are used, this method is susceptible to mask misalignments. Furthermore, angled implantation is used for forming the layers, which makes the implantation more difficult. As the n source layers and the p contact layer have a comparable high doping concentration, there is a danger in the transition area between the two layers of compensated charges, i.e. there may be no dominating charge so that there is an undesired neutralized zone.

DISCLOSURE OF INVENTION

It is an object of the invention to provide an improved method for manufacturing a power semiconductor device having improved electrical properties comprising the following manufacturing steps:
(a) providing a wide bandgap substrate having a lowly doped layer of a first conductivity type forming a drift layer in the semiconductor device, the substrate having a first side and a second side opposite to the first side, wherein the lowly doped layer is arranged on the first side,
(b) then forming on the first side two source regions of the first conductivity type having higher doping concentration than the drift layer up to a source region depth, at least one channel layer of a second conductivity type, which is different from the first conductivity type, having a channel layer depth and surrounding the two source regions in a lateral direction, which direction is parallel to the first side, thereby separating the two source regions from the drift layer in the lateral direction, and
at least one well layer of the second conductivity type having a well layer depth, which is at least as large as the channel layer depth, and having a higher doping concentration than the at least one channel layer, wherein the at least one well layer separates the two source regions from the drift layer on a side of the at least one well layer opposite to the first side, wherein first applying a first mask with openings,
then forming the two channel layers by applying a first dopant of the second conductivity type up to the channel layer depth,
then applying a further layer on the lateral sides of the first mask, by which further layer the openings are narrowed, thereby forming a second mask,
then forming the two source regions by applying a second dopant of the first conductivity type up to the source region depth,
then removing such part of the second mask, which is arranged between the two source regions, thereby forming a third mask,
then forming the at least one well layer by applying a third dopant of the second conductivity type for up to the well layer depth,
(c) after step (b) forming a plug of the second conductivity type having a plug depth, which is at least as great as the well layer depth, and having a higher doping concentration than the at least one well layer, wherein the plug is arranged between the two source regions,
(d) after step (c) forming two gate electrodes on the first side, each of which is separated from any doped layer by an insulating layer,
(e) after step (c) forming a first main electrode as an ohmic contact on the first side, which at least contacts the two source regions and the plug.

The masks for forming the well and the channel layers are self-aligned to the mask for forming the n source regions, which makes the manufacturing method reliable and of high quality due to the mask for forming the plug covering the n source regions completely, there is no overcompensation of the charges of the n source regions and the plug, which means that there is no neutral zone in the device, which allows better operation of the device. The channel and well layers have a much lower doping concentration than the source regions, so that an overcompensation of these layers does not lead to a neutralized zone, but allows to provide an easy manufacturing method.

Figure 19:
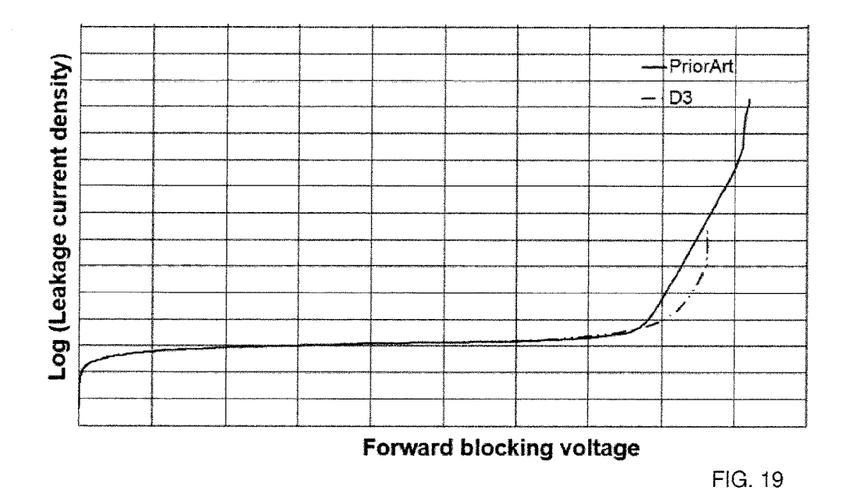
FIG. 19 shows the diminishing of short-channel effects which cause premature breakdown.

A MOS (metal-oxide-semiconductor) cell is formed by the layers/regions mentioned beforehand. The deep highly doped plug improves the contact to the well layer. Its depth is as least as great as the depth of the well layer to protect the channel layers of the MOS cell from peaks of the electric field, which are highest underneath the center of the MOS cell, i.e. below the location of the plug. This avoids undesired parasitic actions (parasitic transistor in case of a MOSFET and parasitic thyristor in case of an IGBT) as well as it diminishes short-channel effects (see FIG. 19). In this FIG. 19, it is shown that for a 300 nm wide channel (being the extension of the channel layer between the source region and the drift layer) the leakage current abruptly rises for forward blocking voltages smaller than the avalanche breakdown voltage, resulting in a premature breakdown of the device. For an inventive MOSFET with the same channel width, breakdown can be shifted to higher forward blocking voltages.

In addition the strength of the electric field in the gate-insulator gets reduced by the plug, wherein the effect is more pronounced for deeper plugs. The FIGS. 15 to 18 show the electric fields through different planes of the MOS-cell of the device. In FIGS. 15 to 18, the plug depth is given relative to the depth of the p well layer. "Prior Art" means that the plug is less deep than the p-well layer. "D1" means that the plug and the p-well layer have the same depth. "D2" shall mean that the plug depth is 1.5 times the well layer depth and "D3" means that the plug depth is two times larger than the well layer depth.

Figure 2:
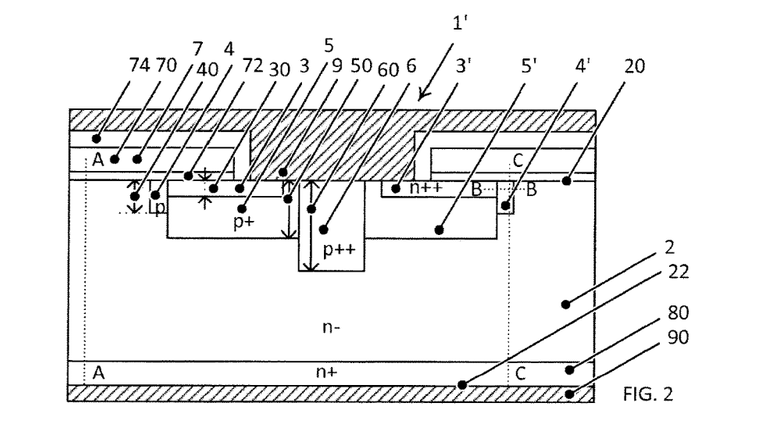
FIG. 2 shows an inventive MOSFET.
Figure 15:
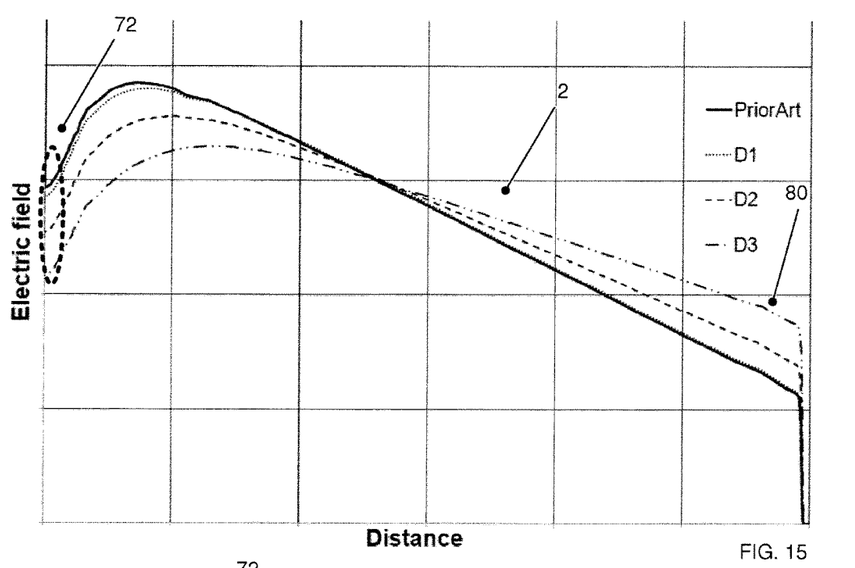
FIGS. 15 to 18 show electric fields along different cuts through the MOS-cell architecture shown exemplary in FIG. 2.
Figure 16:
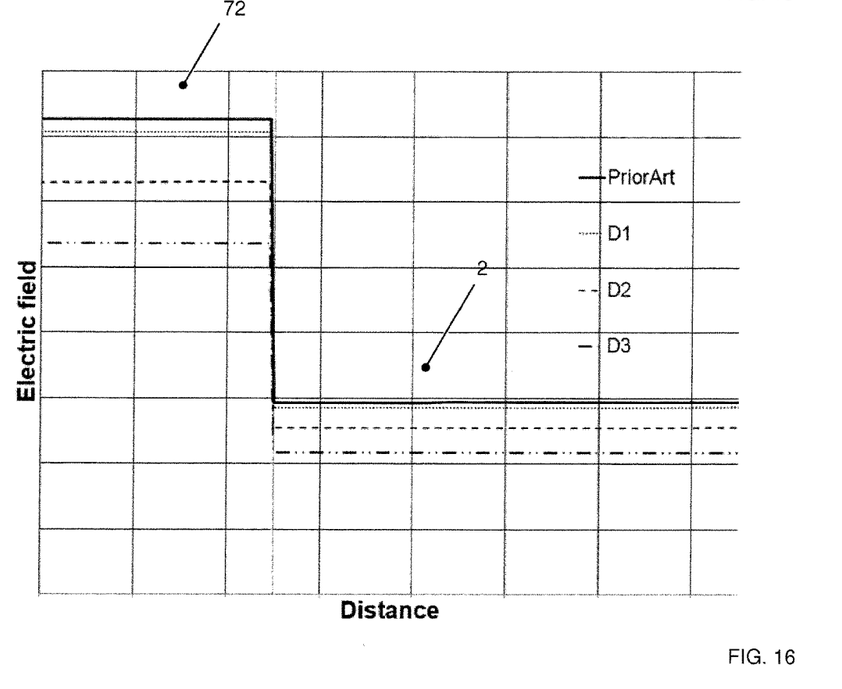
Figure 17:
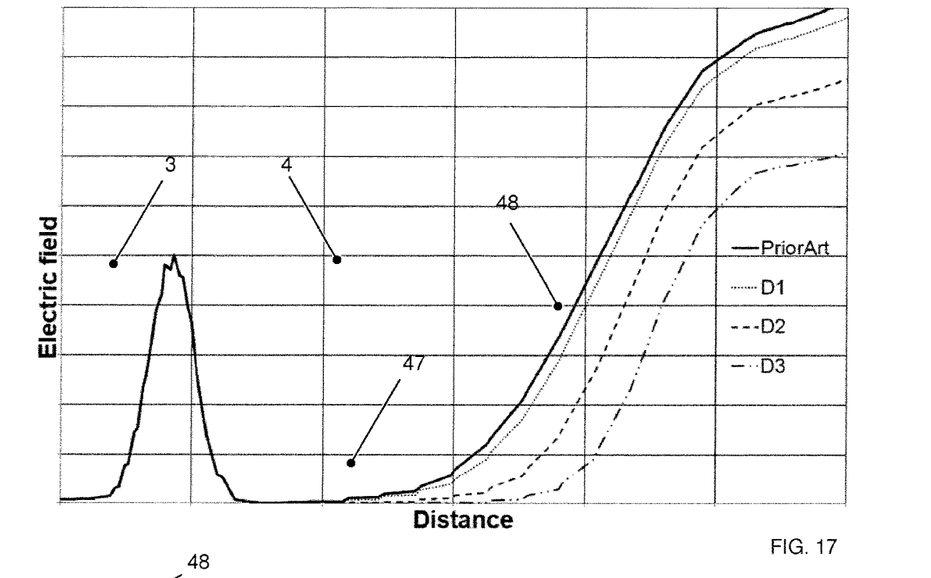
Figure 18:
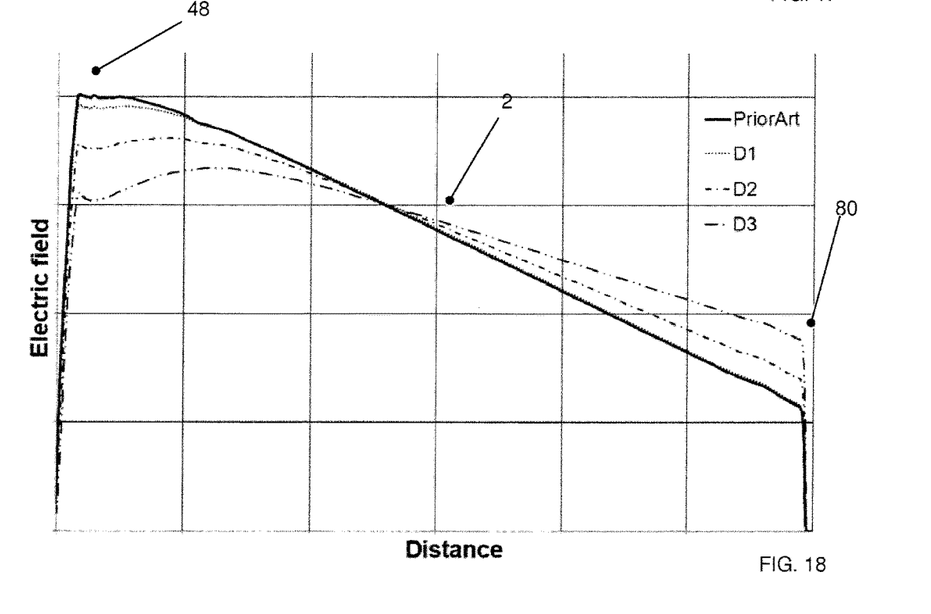

FIG. 15 shows the electric field from the first to the second main side between two MOS cells (cut along line A-A in FIG. 2). FIG. 16 is a detail from FIG. 15 at the interface between the first insulating layer 72 of the gate electrode 7 and the drift layer 2 (dotted area of FIG. 15). From this figure it is obvious, that the electric field is reduced in the wide bandgap material as well as in the insulating layer of the gate electrode (e.g. gate oxide). FIG. 17 shows the electric field in a plane parallel to the first main side (cut along line B-B in FIG. 2); showing the electric field in a non-depleted region 47 of the channel layer and in a depleted region 48 of the channel layer. FIG. 18 shows the electric field along line C-C in FIG. 2, which plane lies parallel to line A-A and goes through the channel layer. For all planes, a tremendous reduction of the electric field is obvious, this effect even being larger, because of the plug in the prior art devices having a plug depth, which is smaller as compared to the well layer depth.

Due to the high doping concentration of the plug a good ohmic contact is established to the first main electrode.

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 1:
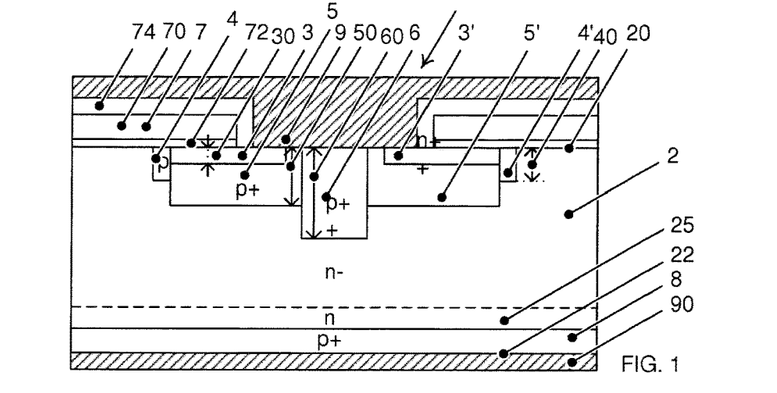
FIG. 1 shows an inventive IGBT.

FIG. 1 shows an inventive insulated gate bipolar transistor (IGBT) 1. The IGBT 1 is a wide bandgap device, e.g. a silicon carbide device, comprising a lowly (n−) doped drift layer 2 between a first main side 20 and a second main side 22 of the device opposite to the first main side 20. Wide band gap materials shall be materials having a bandgap of at least 2 eV like silicon carbide, gallium nitride or diamond not excluding other wide bandgap materials. Depending on the voltage class, the doping concentration and thickness of the drift layer 2 are chosen. Exemplarily, the drift layer 2 has a doping concentration between $1*10^{12}$ and $1*10^{17}$ cm$^{-3}$ and a thickness between 1 to 500 μm. The thicknesses shall be measured in depth direction, i.e. in a direction vertical to the first main side 20.

For an inventive IGBT, a p+ doped collector layer 8 is arranged on the second main side 22 and has exemplarily a doping concentration between $1*10^{18}$ and $1*10^{20}$ cm$^{-3}$. The collector layer 8 contacts a second main electrode 90, which is a collector electrode for an IGBT. Between the drift layer 2 and the collector layer 8, an n doped buffer layer 25 may be arranged, which has a higher doping concentration than the drift layer 2 (shown in FIG. 1 by a dashed line). The buffer layer may have an exemplary doping concentration between $1*10^{17}$ and $1*10^{19}$ cm$^{-3}$ and a thickness up to 3 μm.

For an inventive MOSFET as shown in FIG. 2, on the second main side 22, an n+ doped drain layer 80 is arranged, which has exemplarily a doping concentration between $1*10^{18}$ and $1*10^{20}$ cm$^{-3}$. The drain layer 80 contacts a second main electrode 90, which is a drain electrode for a MOSFET.

In the following, the design on the first main side 20 is further explained for the example of an IGBT (FIG. 1), but is also applicable to a MOSFET (FIG. 2).

On the first main side 20 two n++ doped source regions 3, 3' having a source region depth 30 are arranged, which have a higher doping concentration than the drift layer 2. All depths shall be measured from the first main side 20, i.e. the depths shall be the maximum distance in depth direction, to which a layer/region extends. Exemplarily, the source region depth 30 measures up to 0.5 μm. The doping concentration may vary between $1*10^{18}$ and $1*10^{21}$ cm$^{-3}$ or between $1*10^{19}$ and $1*10^{21}$ cm$^{-3}$. Exemplarily, the source regions 3, 3' belonging to one MOS cell have a lateral distance from each other of up to 7 μm.

On both outer lateral sides of the source regions 3, 3' (on the outer lateral sides of the n++ source regions not facing each other, i.e. which do not form a common opening in between, and which lie below a gate electrode 7) p doped channel layers 4, 4' are arranged. Thus, the p channel layers 4, 4' surround the n source regions 3, 3' on the outer lateral sides, i.e. on a side of the n source regions 3, 3' parallel to the first main side 20 and below the gate electrodes 7. Exemplarily, the channel layers 4, 4' have a channel layer depth 40, which is deeper than the source region depth 30. Each source region 3, 3' is separated from the drift layer 2 in lateral direction by a channel layer 4, 4' in a direction parallel to the first main side 20. The channel layer 4, 4' may have a doping concentration between $1*10^{16}$ and $1*10^{18}$ cm$^{-3}$.

P+ doped well layers 5, 5' which have a higher doping concentration than the channel layers 4, 4', separate the two source regions 3, 3' from the drift layer 2 on a side of the well layer opposite to the first main side 20.

Exemplarily, the doping concentration of the well layers 5, 5' may be at least 10 times higher than the doping concentration of the channel layers 4, 4' or the doping concentration of the well layers 5, 5' may be between 10 times and 100 times higher than the doping concentration of the channel layers 4, 4'. The well layers 5, 5' may have a doping concentration between $1*10^{17}$ and $1*10^{21}$ cm$^{-3}$ or $1*10^{18}$ and $1*10^{20}$ cm$^{-3}$.

The well layers 5, 5' have a well layer depth 50, which is at least as large as the channel layer depth 40. Thus, the well layers 5, 5' may extend to the same depth as the channel layers 4, 4' or they may be deeper than the channel layers 4, 4'. The depth of the well layers 5, 5' and/or the channel layers 4, 4' may exemplarily be up to 3 µm.

In the channel layers 4, 4', a MOS channel may be formed from the source regions 3, 3' to drift layer 2. The channel extends in the substrate product 10 from the source region 3, 3' close to the surface to the drift layer 2. Thus, the doping concentration of the channel layers 4, 4', which has to be lower than the doping concentration of the well layers 5, 5', is the doping concentration from the first main side 20 at maximum up to the depth of the source regions 3, 3', i.e. up to a depth, in which the channel is formable.

The channel layers 4, 4' and well layers 5, 5' may be designed as common layers (combined layer 4, 5 and combined layer 4', 5')) having a retrograde profile, such that the common layers have a low doping concentration at the first main side and in the region beneath, i.e. close to the first main side, and lateral to the source regions 3, 3' (in which region the channel is formable) up to the source region depth 30 (in which region the channel is formable), and the doping concentration then rises to a higher value underneath the source regions 3, 3'. For the formation of the channel it is of inferior importance that the common layer has a higher doping concentration lateral to the source region, but in greater depth than the source regions 3, 3' (due to the common layer having a retrograde profile), because in such a great depth no channel is formed. The higher doping concentration of the common layer lateral to the source region, but in greater depth than the source regions 3, 3' improves the shielding of the high electric field (inside the device during blocking conditions) from the channel layer.

Between the two source regions 3, 3', a p++ doped plug 6 is arranged, which has a higher doping concentration than the well layers 5, 5'. In an exemplary embodiment, the doping concentration of the plug 6 is at least 10 times higher than the doping concentration of the well layer 5, 5'. In another exemplary embodiment, the doping concentration of the plug 6 is between 10 times and 100 times higher than the doping concentration of the well layer 5, 5'. The plug 6 may have a doping concentration between $2*10^{17}$ and $2*10^{21}$ cm$^{-3}$ or between $1*10^{19}$ and $2*10^{21}$ cm$^{-3}$.

The plug 6 has a plug depth 60, which is as least as deep as the well layer depth 50, exemplarily greater than the well layer depth 50. The plug 6 does not overlap with the n source regions 3, 3', i.e. the doping concentration of the n source regions 3,3' is constant in planes parallel to the first main side 20 and the doping concentration of the p plug is constant in planes parallel to the first main side 20. The doping concentration of the n source regions 3, 3' and of the plug 6 is not compensated at the interface between the two layers 3, 6 or 3', 6.

Between the plug 6 and the two source regions 3, 3', the well layer 5, 5' may extend to the first main side 20 and contact the first main electrode 9. Thus, the well layers 5, 5' may separate the plug 6 from the source regions 3, 3'. By such an arrangement, it is ensured that the source regions 3, 3' do not overlap with the plug 6. As the intrinsic doping level of a wide bandgap semiconductor material is negligible as compared to a low-band gap semiconductor material (e.g. Silicon) and as the doping concentrations of the plug 6 and source regions 3, 3' are within the same order of magnitude, by an overlap of the n and p doped layers a region could be formed, in which no dopant is electronically active, i.e. such a region would be insulating. Such an effect is avoided by the inventive structure.

The source regions 3, 3' are separated from the drift layer 2 by the plug 6, the well layers 5, 5' and the channel layers 4, 4'.

The plug 6, the well layers 5, 5' (if they extends to the first main side 20), the source regions 3, 3', the channel layers 4, 4' and the drift layer 2 form a planar plane on the first main side 20. Thus, these layers form a common surface on the first main side 20, which is planar.

On the first main side 20, gate electrodes 7 are arranged, each of which comprises a first insulating layer 72, a second insulating layer 74 and a gate layer 70, which is separated from any doped layer by the first insulating layer 72. The source regions 3, 3', the channel layers 4, 4' and the drift layer 2 extend to the gate electrode 7, i.e. to the first insulating layer 72. The gate electrodes 7 are formed as a planar gate electrodes (as shown in FIGS. 1 and 2), wherein the gate electrodes 7 are arranged on top of the source regions 3, 3', the channel layers 4, 4' and the drift layer 2 such that a MOS channel may be generated in the channel layer 4, 4' below the gate electrode 7 between the source regions 3, 3' and the drift layer 2 by inversion of the channel layer p by the application of a gate-voltage larger than the threshold-voltage of the MOS interface.

In case of the first insulating layer 72 being an oxide layer and the gate layer 70 being a metal, the inversion-channel is called a MOS channel (metal-oxide/insulator-semiconductor), whereas otherwise (insulating layers 72, 74 being made of any insulating materials; e.g. dielectrics such as high-k materials or Silicate glasses such as PSG or BPSG not excluding other insulators) the channel may also be called MIS channel (metal-insulator-semiconductor). As a material for the gate layer 70 any appropriate electrically conductive material like a metal or doped polycrystalline silicon may be used. The term MOS device/MOSFET shall also cover such MIS devices/MISFETs and applies also for IGBTs which are MOS/MIS-controlled.

A first main electrode 9 is formed as an ohmic contact on the first main side 20, which contacts the two source regions 3, 3' and the plug 6, and if the well layer 5, 5' extends to the surface on the first main side 20, also the well layer 5, 5' contacts the first main electrode 9. For an IGBT 1 as shown in FIG. 1 the first main electrode 9 functions as an emitter electrode, for a MOSFET as shown in FIG. 2, the first main electrode 9 functions as a source electrode. The first main electrode 9 may be formed by first forming a metallic layer in the opening between two gate electrodes 7 to form an ohmic contact to the plug 6, the well layer 5, 5' and the source regions 3, 3'. On top of the metallic layer forming the ohmic contact, another metallic layer is then generated, which contacts the first metallic layer. Additionally the second metallic layer also covers the area on top of the gate electrode 7, i.e. it covers the second insulating layer 74 and is thereby insulated from the gate layer 70.

The structure disclosed beforehand forms a MOS cell to control an IGBT and/or MOSFET. The MOS cell is formed between one first main electrode contact opening and the second electrode 90, i.e. the MOS comprises the plug 6, the well layers 4, 4' on both sides of the plug 6, the source regions 3, 3', the channel layers 4, 4', the drift layer 2 and the collector layer 8 or the drain layer 80.

The cells, i.e. the regions in the cell may be designed to form of regular patterns like stripes, hexagonal, triangular or square design. In a power semiconductor device, one or more of such MOS cells may be arranged. Such MOS cells may be interconnected to each other.

The devices may be designed as vertical devices as shown in the FIGS. 1 and 2, but it is also possible to have them designed as lateral devices, in which source and drain (MOSFET) or emitter and collector (IGBT) are arranged on the same side of the device. For an inventive IGBT, the inventive deep plug 6 is applicable for all different kinds of IGBTs such as reverse conducting IGBTs having alternatingly p+ collector regions and n+ short regions arranged on the second main side 22, exemplarily also as a Bi-mode Insulated Gate Transistor (BIGT) additionally having a large pilot p+ collector region in the central part of the device on the second main side 22 surrounded by alternating smaller p+ and n+ short regions. The pilot and short regions may be connected. Such BIGTs are disclosed in U.S. Pat. No. 8,212,283 B2, which document shall be incorporated by reference for the design of a BIGT.

The inventive IGBT may be designed as a non punch-through IGBT or as a punch-through/soft-punch-through IGBT having a buffer layer 25 arranged between the n– doped drift layer 2 and the p+ doped collector layer 8. In case of the non-punch through design the E-field is triangular in shape up to avalanche breakdown. In the other cases the E-field penetrates through the interface between drift layer 2 and buffer layer 25 where it gets stopped due to the high doping concentration of the buffer layer.

Super-Junction designs are possible for all kind of inventive devices. An exemplary technological approach for superjunctions is based on either trench-etching followed by epitaxial-refill or sequential epitaxial growth followed by multiple implantation, not excluding other techniques.

For manufacturing an inventive wide bandgap semiconductor device, the following manufacturing steps are performed. In a step (a) a wide bandgap substrate product 10 having a lowly doped layer of a first conductivity type forming a drift layer 2 in the semiconductor device is provided. The substrate product 10 has a first side 12 and a second side 14 opposite to the first side 12, wherein the lowly doped layer is arranged on the first side 12. On the second side 14, the substrate product 10 comprises in the case of a vertical IGBT a p+ doped substrate, which or part of which forms the collector layer 8 in the finalized IGBT device. The layer 8 may be thinned down at the end of the manufacturing process.

In a step (b) on the first side 12 two n doped source regions 3, 3' having higher doping concentration than the drift layer 2 are formed up to a source region depth 30. At least one p doped channel layer 4, 4' having a channel layer depth 40 is formed. Each source region 3, 3' is separated from the drift layer 2 by a channel layer 4, 4' in a direction perpendicular to the first side 12. The channel layer depth 40 is larger than the source region depth 30. At least one p+ doped well layer 5, 5' having a well layer depth 50, which is at least as large as the channel layer depth 40, and having a higher doping concentration than the at least one channel layer 4, 4' is formed. The well layer 5, 5' separates the two source regions 3 from the drift layer 2 on a side of the well layer opposite to the first side 12.

In a step (c) and after step (b) a p++ doped plug 6 is formed having a plug depth 60, which is larger than the well layer depth 50. The plug is arranged between the two source regions 3, 3'. The doping concentration of the plug 6 is larger than that of the well layer 5. The doping concentration of the plug may be at least 10 times higher than the doping concentration of the well layer 5. In another exemplary embodiment, the plug 6 may be formed with a doping concentration, which is between 10 times and 100 times higher than the doping concentration of the well layer 5. The plug 6 may be formed with a doping concentration between $2*10^{17}$ and $2*10^{21}$ cm$^{-3}$ or between $1*10^{19}$ and $2*10^{21}$ cm$^{-3}$. The plug may have a width of at maximum 5 µm or at maximum 3 µm.

In a step (d) after step (c) gate electrodes 7 are formed on the first side 12. Each gate electrode 7 comprises an electrically conductive gate layer 70, which is separated from any doped layer by an insulating layer in form of a thin first insulating layer 72. Exemplarily, a second insulating layer 74, which is thicker than the first insulating layer 72, is formed on top of the gate layer 70.

In a step (e) after step (c) a first main electrode 9 is formed as an ohmic contact on the first side 12, which at least contacts the two source regions 3, 3' and the plug 6.

Figure 3:
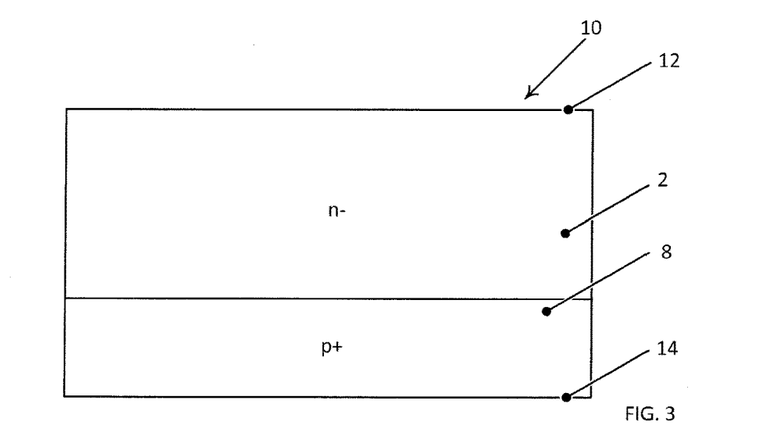
FIGS. 3 and 5 to 13 show steps for an inventive method for manufacturing a wide bandgap semiconductor device (IGBT/MOSFET)

In the FIGS. 3 and 6 to 13 a method for manufacturing a wide bandgap non punch-through power IGBT is shown. In FIG. 3 the substrate product of step (a) is shown. The substrate product 10 comprises a lowly doped layer forming the drift layer 2 in the device. On the second side 14, the substrate product 10 comprises a higher p+ doped layer forming the collector layer 8. Exemplarily the substrate product 10 is made by providing a p+ doped substrate, which forms a collector layer 8 in the finalized IGBT, on which a lowly (n–) doped layer as a drift layer 2 is formed, exemplarily by epitaxial growth. The p+ doped layer may be thinned down at the end of the manufacturing process to form the collector layer 8.

Figure 4:
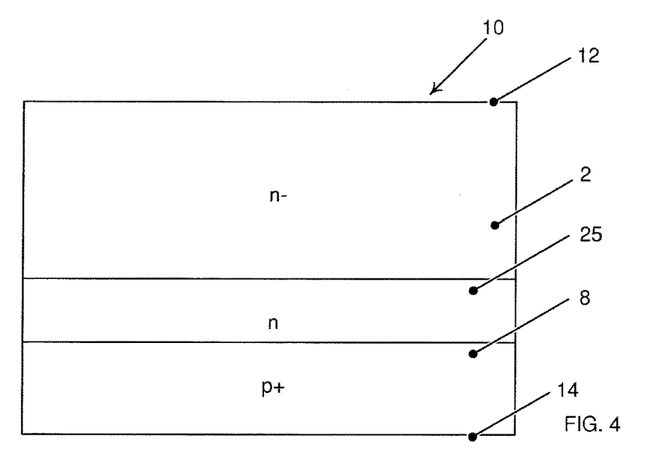
FIG. 4 shows an alternative manufacturing step (a)

Alternatively, as shown in FIG. 4, for a punch-through IGBT, in which a buffer layer 25 is arranged between the drift layer 2 and the collector layer 8, a p+ doped substrate may be provided. On the p+ doped substrate, first an n doped buffer layer 25 and then an n– doped drift layer 2 is formed, exemplarily by epitaxial growth. Again, the p+ doped layer may be thinned down at the end of the manufacturing process to form the collector layer 8.

By such an epitaxial growth, exemplarily a layer of constant doping concentration is formed, but of course also a variation of doping concentration is possible, e.g. a decreasing doping concentration in direction from the first side 12 to the second side 14. The values for the doping concentration given above shall be understood as the mean doping concentration in case of constant doping concentration (not excluding variation of doping concentration due to imperfection of the manufacturing method) or as a maximum doping concentration in case of varying doping concentration. The same shall apply for implanted profiles which are defined by multiple cascades with different energies and doses and may form any kind of graded profile by the superposition of several Gaussian profiles, for each cascade one Gaussian profile.

Figure 5:
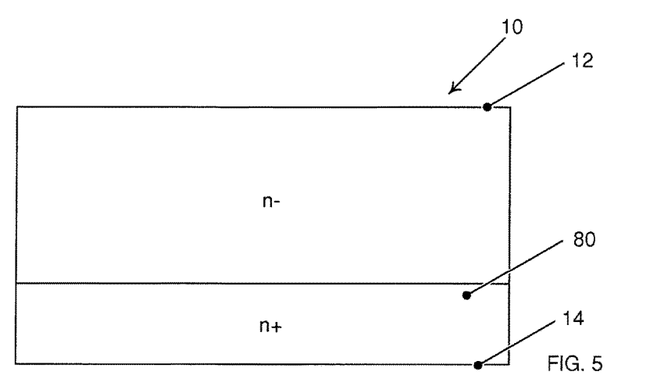

For forming an inventive MOSFET, a substrate product 10 may be provided (FIG. 5) which is made by providing an n+ doped substrate, which or part of which forms the drain layer 80 in the finalized MOSFET device. On the n+ doped substrate, a drift layer 2 may be formed, e.g. by epitaxial growth. The n+ doped layer may be thinned down at the end of the manufacturing process to form the drain layer 80.

Figure 6:
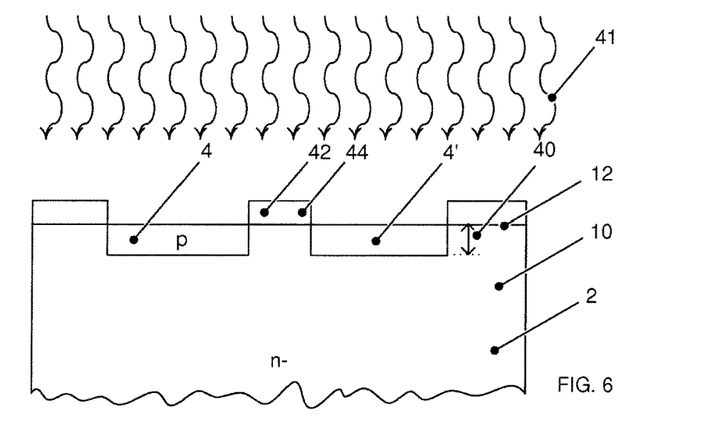

In step (b) first a first mask 42 having a polycrystalline silicon layer 44 with openings for forming two separate channel layers 4, 4' (for each semiconductor cell, i.e. for each area in which the first main electrode 9 contacts the substrate at one opening), is applied as shown in FIG. 6. Exemplarily, for forming the first mask 42, first a continuous stack of layers comprising a thin oxide ($SiO_2$), polycrystalline silicon and oxide layer is formed, which is then etched down to form the first mask 42 having two openings for the channel layers 4, 4'. Exemplarily, the openings have a width of up to 5 µm (width shall be the largest diameter of a circle that may be laid into a region/opening in a plane parallel to the first side 12) and a distance between the two openings up to 7 µm. The total mask stack shall have such a thickness that a dopant is hindered from penetration into the substrate product 10 in such areas, which are covered by the mask. The dopants shall penetrate into the substrate product 10 at the positions of the mask openings.

Then a first dopant 41 (p dopant) is applied, e.g. by implantation or deposition for forming the channel layers 4, 4'. In an exemplary embodiment, aluminum or boron is applied as first dopant 41. This process may be performed at an elevated temperature, exemplarily at a temperature up to 700° C. All dopants 31, 41, 51, 61 are applied at any appropriate angle to the first main side 20. They may be applied perpendicular to the first main side 20, but if desired any other incident angle may be used.

For the implantation (deposition) a dose between $1*10^{11}$ and $1*10^{16}$ $cm^{-2}$ and/or an energy between 1 keV and 1 MeV may be applied. Thus, channel layers 4, 4' may be formed having a doping concentration between $1*10^{16}$ and $1*10^{18}$ $cm^3$. The first dopant 41 may be applied into a channel layer depth 40 of at maximum 2 µm.

Then another oxide layer 45 is generated as further layer (e.g. by oxidizing the polycrystalline silicon layer to form another oxide layer), which covers the remaining polycrystalline silicon layer 44 to the top and lateral sides, so that the openings are narrowed (FIG. 7), thereby forming a second mask 32, which is self-aligned to the first mask 42. The exemplarily described process may be called self-aligned process by oxidation of polycrystalline silicon. Again, the total mask stack shall have such a thickness that a dopant is hindered from penetration into the substrate product 10 in such areas, which are covered by the mask.

Figure 7:
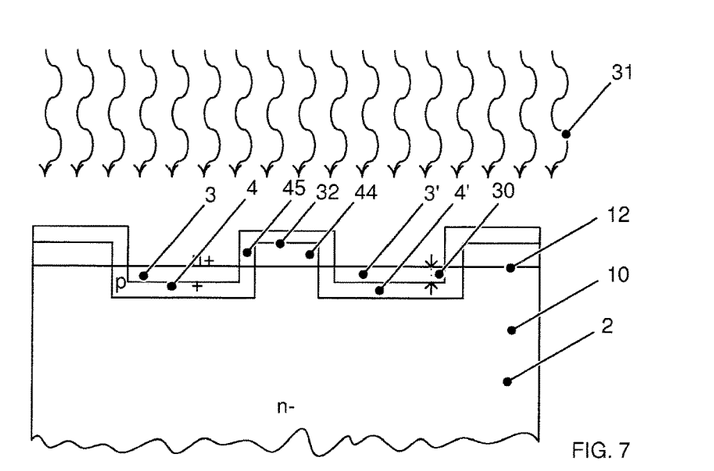

Then a second n dopant 31 is applied (implanted/deposited) for forming the two source regions 3, 3'. These source regions 3, 3' are shallower, but higher doped than the channel layers 4, 4', so that the channel layers 4, 4' separate the source regions 3, 3' from the drift layer 2 in a direction perpendicular to the first side 12. The second dopant 31 is applied with a dose of exemplarily between $1*10^{13}$ and $1*10^{16}$ $cm^{-2}$ and/or an energy between 1 keV and 500 keV up to a source region depth 30 of exemplarily at maximum 0.5 µm.

Figure 20:
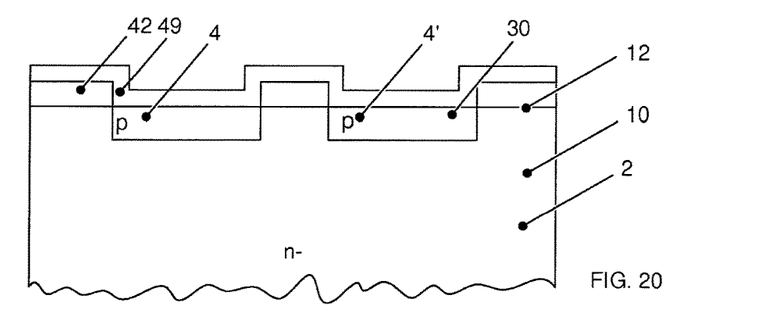
FIGS. 20 and 21 show manufacturing steps of an alternative manufacturing method (step (b)).
Figure 21:
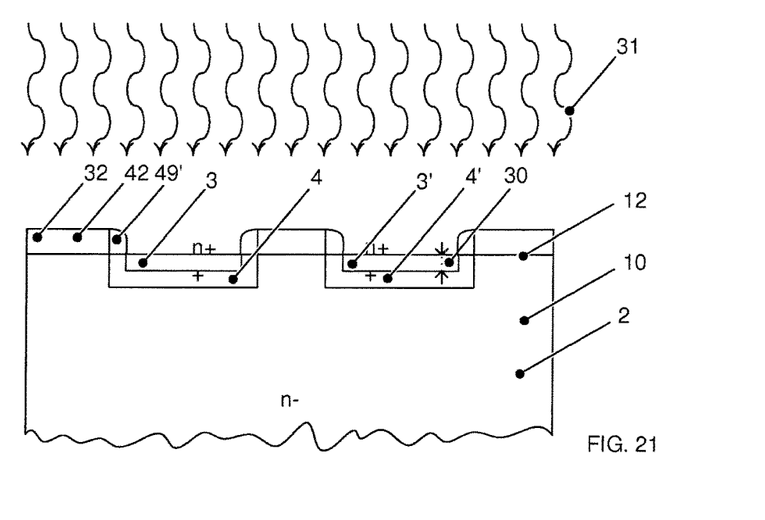

In an alternative method, for forming the first mask 42, a continuous stack of layers as described beforehand (i.e. base mask layer, which may be an oxide layer, a polycrystalline silicon layer and a covering mask layer). Again, these layers are etched to form two openings for each semiconductor cell and a first dopant 41 is applied (FIG. 6). Then a top mask layer 49 is applied as a continuous layer, exemplarily by deposition, which is made of a different material than the covering mask layer of the first mask, exemplary silicon nitride or polycrystalline silicon (FIG. 20). Afterwards, an etch step (exemplarily a dry etch) is performed without a protection mask. By this step the top mask layer 49 is removed on top of the first mask 42 and in the first mask openings, but remaining at the lateral sides of the first mask 42. The etch process stops at the covering mask layer of the first mask 42 and on the SiC substrate product 10. Thus, the top mask layer material or at least part of the top mask layer material remains on the lateral sides of the first mask 42, which face the openings (thereby forming a remaining top mask layer 49'), such that the first mask 42 and the remaining top mask layer 49' form a second mask 32 (FIG. 21). The etch step is performed in a directional manner such that the top mask layer is sensitive to the etching (i.e. the top mask layer is removed on the top of the first mask 42 and at the bottom of the first mask openings) but such that it remains on the sidewalls of the first mask 42 and such that the covering mask layer acts as an etch stop. This means, that a so-called "spacer" is generated by the top mask layer (e.g. SiN, polycrystalline silicon or SiO2) in an analogously self-aligned manner as in the aforementioned case of thermal oxidation of polycrystalline silicon. This technological approach may be called self-aligned process by spacers (not shown in a figure).

Figure 8:
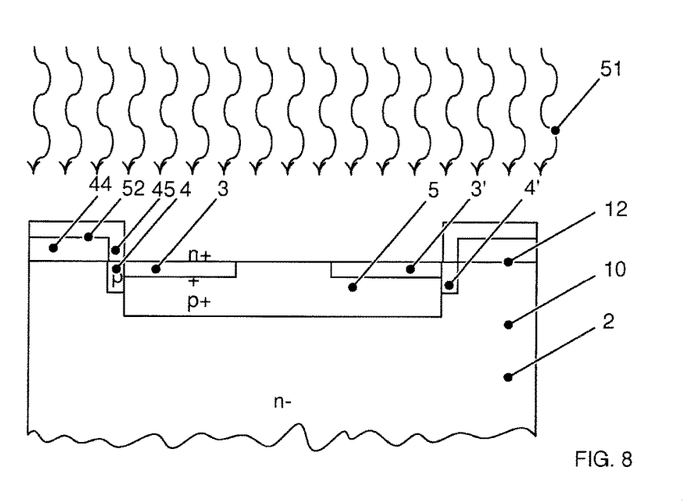

After having performed either of the aforementioned processes (self-aligned process by oxidation of polycrystalline silicon or self-aligned process by spacers), the first mask 42 and further layer 45 or 49' are removed between the two source regions 3, 3', thereby forming a third mask 52, which has the same lateral extension as the outer limits of the openings of the second mask 32, but forms only one opening (FIG. 8). This mask 52 is again self-aligned to the first and second mask 42, 32. A third dopant 51 (p dopant) is applied (implanted/deposited) for the formation of the well layer 5, 5' up to the well layer depth 50. The third dopant 51, e.g. aluminum or boron, is applied with a dose between $1*10^{11}$ and $1*10^{16}$ $cm^{-2}$ and/or an energy between 1 keV and 1 MeV up to a well layer depth 50 of exemplarily at maximum 2 µm. The well layer 5 is formed to have a doping concentration, which is at least 10 times higher than the doping concentration of the at least one channel layer 4, 4' or, exemplarily to have a doping concentration which is between 10 times and 100 times higher than the doping concentration of the at least one channel layer 4, 4'. The doping concentration of the well layer 5 may be between $1*10^{18}$ and $1*10^{20}$ $cm^{-3}$ or between $1*10^{17}$ and $1*10^{21}$ $cm^{-3}$.

The well layers 5, 5' may also be formed with a retrograde profile, which means that a maximum doping concentration of the well layers 5, 5' is arranged close to the p/n junction to the drift layer 2, whereas the local doping concentration decreases towards the first main side 20. The doping concentrations of the layers/regions shall be understood as the maximum doping concentrations of the layers/regions if not stated otherwise.

Again, the implantation/deposition may be performed at a temperature higher than room temperature, exemplarily at a temperature up to 700° C. The well layer depth 50 is at least as large as the channel layer depth 40. It shall be ensured that the well layer doesn't deplete during blocking conditions, thereby preventing a short between the first and second main electrode.

The source regions 3, 3' are overcompensated layers, which means that in these layers also a dopant of the other conductivity type is present, e.g. in the source regions 3, 3' also the first dopant 41 for the channel layer 4, 4' and the third dopant 51 for the well layer 5, 5' are applied, but as the second n dopant 31 dominates, this layer is n-type (higher n-doping concentration).

Figure 9:
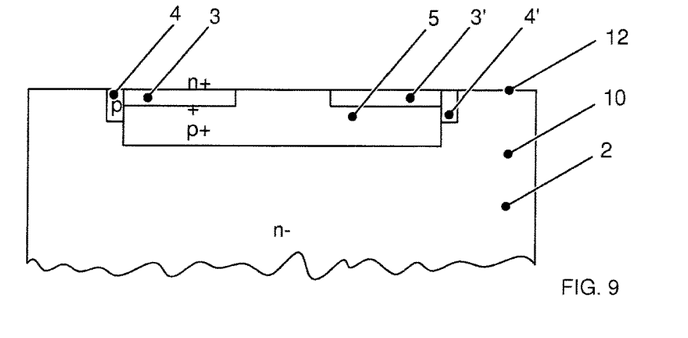
Figure 10:
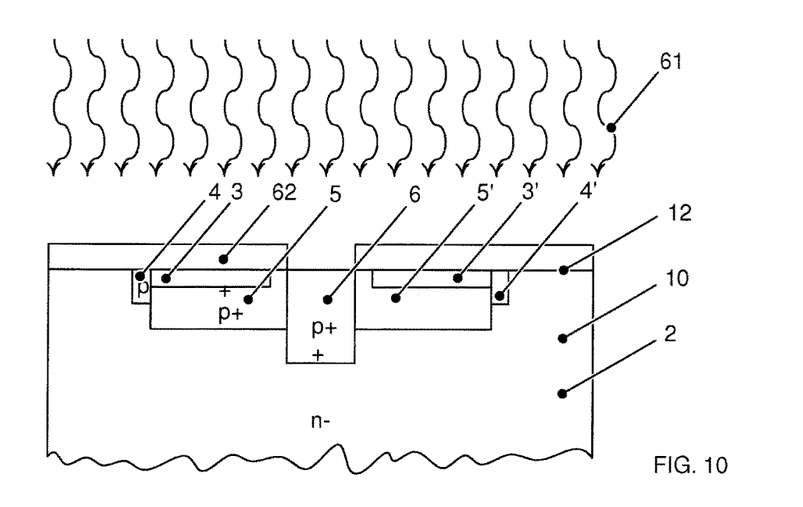
Figure 11:
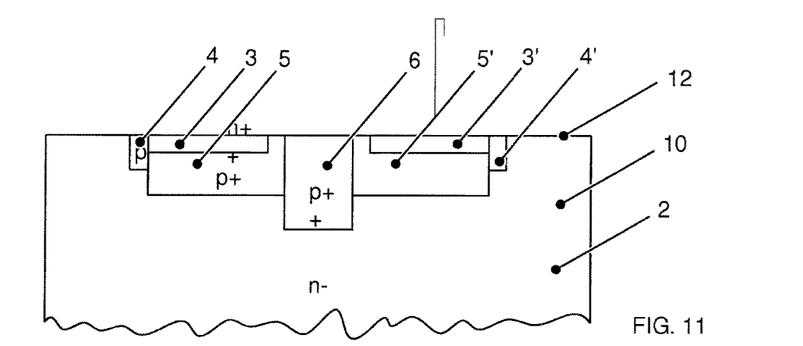
Figure 12:
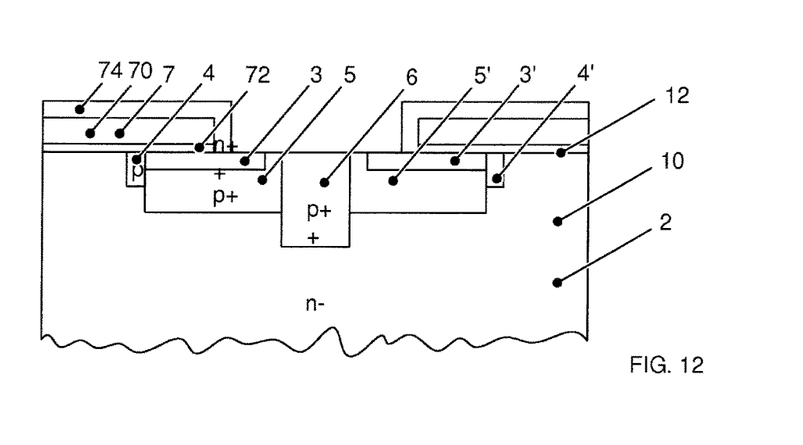

As shown in FIG. 9, the third mask 52 is then removed after having formed the source regions 3, 3', channel layers 4, 4' and well layer 5. A new continuous mask material layer which can be made from oxide is applied and etched to have an opening above the region between the two source regions 3, 3', thereby forming a fourth mask 62 (FIG. 10). A fourth dopant 61 (p dopant, e.g. Al or B) may be applied, e.g. with a dose between $1*10^{11}$ and $1*10^{16}$ cm$^{-2}$ and/or an energy between 1 keV and 1 MeV up to a plug depth 60, which is at least as great as or greater than the well layer depth 50. Exemplarily, the plug depth 60 is 1.05 to 1.5 times (i.e. 5 to 50%) or up to two or even up to four times larger than the well layer depth 50 (FIG. 10). An activation anneal step at a high temperature, e.g. between 1500° C. to 1900° C. may follow. Afterwards, a sacrificial oxidation step may be performed. Due to the introduction of the plug 6, the well layer 5 is split into two well layers 5, 5'.

Figure 13:
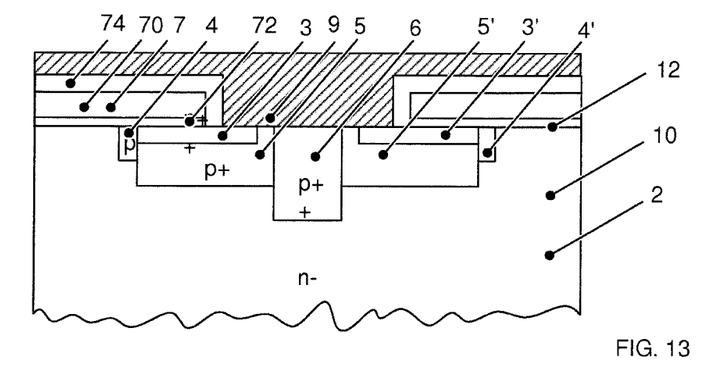

Now the fourth mask 62 is removed (FIG. 11) and gate electrodes 7 are formed (FIG. 12) by applying first insulating layer 72s, which cover the drift layer 2 at those parts extending to the surface at the first side 12, the channel layers 4, 4 and the outer parts of the source regions 3, 3'. The outer parts shall means those parts of the two source regions 3, 3' not facing each other. An electrically conductive gate layer 70 is applied and on top of it, a second insulating layer 74 is applied which electrically insulates the gate layer 70 from the first main electrode 9. In the opening on top of the source regions 3, 3' not covered by the gate electrode 7 with the plug 6 and the well layer 5, 5' in between, a first main electrode 9 as ohmic contact in form of an emitter electrode for an IGBT 1 or a source electrode for a MOSFET 1' (metal-oxide semiconductor field-effect transistor) is formed. Exemplarily, the first main electrode 9 is formed by first applying a metallic layer in the opening to contact the p++ plug 6, the well layers 5, 5' and the source regions 3, 3' and then another metallic layer additionally covering the second insulating layer 74 on top of the gate layer 70 is applied (FIG. 13).

On the second side 14, a second main electrode 90 as ohmic contact in form of a collector electrode for an IGBT 1 or a drain electrode for a MOSFET 1' is formed.

In the process, shown in the FIGS. 6 to 13, p channel layers 4, 4' and source regions 3, 3' are formed in one MOS cell as separate regions, wherein the well layers 5, 5' are first formed as one common layer (FIG. 8) and by the introduction of the p++ plug 6 the well layer 5, 5' is split into two separate well layers 5, 5' on the lateral sides of the plug 6. Therefore, the term well layer shall also cover two well layers 5, 5', separated from each other by the plug 6 and the term channel layer shall cover two channel layers 4, 4', separated from each other by the well layers 5, 5'.

In another alternative manufacturing method, in step (b) a retrograde p doped layer as a common channel and/or well layer (4, 4', 5, 5') is formed and source regions 3, 3' are formed before or after the retrograde layer (4, 4', 5, 5'). The retrograde layer (4, 4', 5, 5') has such doping concentration that on the outer lateral sides of the source regions 3, 3' the retrograde layer has a low doping concentration (i.e. channel layers 4, 4') at the first side 12, which then rises to greater depths (at least up to the source region depth 30) to a high doping concentration below the source regions 3, 3' (i.e. well layers 5, 5'). By the later introduction of the plug 6 the common retrograde layer is split into a retrograde layer 4, 5 and 4', 5'.

The plug 6 may also be formed as a retrograde layer having a lower doping concentration in shallow depth and a higher up to a maximum doping concentration in greater depth, which depth may exemplarily be located as deep as the depth of the maximum doping concentration of the well layers 5, 5' or deeper.

The inventive structure and manufacturing method having a deep p++ plug may be applied to different semiconductor devices having MOS cell structures such as MOSFETs and MOS controlled IGBTs.

In another embodiment, the conductivity types of the layers are switched, i.e. all layers of the first conductivity type are p type (e.g. the drift layer 2 and the source regions 3) and all layers of the second conductivity type are n type (e.g. channel layer 4, the well layer 5 and the plug 6).

REFERENCE LIST

1 IGBT
1' MOSFET
10 wide bandgap substrate product
12 first side
14 second side
2 drift layer
20 first main side
22 second main side
25 buffer layer
3, 3' source region
31 second dopant
30 source region depth
32 second mask
34 fourth mask
35 first mask layer
35' remaining first mask layer
36 second mask layer
4, 4' channel layer
41 first dopant
40 channel layer depth
41 first dopant
42 first mask
44 polycrystalline silicon layer
45 oxide layer
46 sixth mask
47 non-depleted channel layer
48 depleted channel layer
49 top mask layer
49' remaining top mask layer
5, 5' well layer
50 well layer depth
51 third dopant
52 third mask
54 fifth mask
6 plug
60 plug depth
61 fourth dopant
62 fourth mask
65 contact layer
67 contact layer depth
7 gate electrode
70 gate layer
72 first insulating layer
74 second insulating layer
8 collector layer
80 drain layer
9 first main electrode
90 second main electrode

The invention claimed is:

1. A method of manufacturing a semiconductor device comprising:
   (a) providing a wide bandgap substrate product having a lowly doped layer of a first conductivity type forming a drift layer in the semiconductor device, the substrate product having a first side and a second side opposite to the first side, wherein the lowly doped layer is arranged on the first side, (b) then forming in the wide bandgap substrate product on the first side two source regions of the first conductivity type having higher doping concentration than the drift layer up to a source region depth, two channel layer of a second conductivity type, which is different from the first conductivity type, having a channel layer depth and surrounding the two source regions in a lateral direction, which direction is parallel to the first side, thereby separating the two source regions from the drift layer in the lateral direction, and at least one well layer of the second conductivity type having a well layer depth, which is at least as large as the channel layer depth, and having a higher doping concentration than the at least one channel layer, wherein the at least one well layer separates the two source regions from the drift layer on a side of the at least one well layer opposite to the first side, wherein first applying a first mask with openings, then forming the two channel layers by applying a first dopant of the second conductivity type up to the channel layer depth, then applying a further layer on the lateral sides of the first mask, by which further layer the openings are narrowed, thereby forming a second mask, then forming the two source regions by applying a second dopant of the first conductivity type up to the source region depth, then removing such part of the second mask, which is arranged between the two source regions, thereby forming a third mask, then forming the at least one well layer by applying a third dopant of the second conductivity type up to the well layer depth, (c) after step (b) applying a fourth mask, which at least covers the two source regions and the two channel layers, then forming a plug by applying a fourth dopant of the second conductivity type having a plug depth, which is at least as deep as the well layer depth, and having a higher doping concentration than the at least one well layer, (d) after step (c) forming two gate electrodes on the first side, each of which is separated from any doped layer by an insulating layer, (e) after step (c) forming a first main electrode as an ohmic contact on the first side, which at least contacts the two source regions and the plug.

2. The method of manufacturing the semiconductor device according to claim 1, wherein
in step (c) applying the fourth mask such that the fourth mask projects a part of the well layer adjoining the two source regions such that the at least one well layer surrounds the plug in the lateral direction and such that the at least one well layer separates the plug from the two source regions.

3. The method of manufacturing the semiconductor device according to claim 1, wherein
in step (c) forming the plug with a doping concentration, which is at least 10 times higher than the doping concentration of the at least one well layer.

4. The method of manufacturing the semiconductor device according to claim 1, wherein in step (b) forming the at least one well layer with a doping concentration, which is at least 10 times higher than the doping concentration of the two channel layers.

5. The method of manufacturing the semiconductor device according to claim 1, wherein
in step (b) forming the at least one well layer with a doping concentration between $1*10^{17}$ and $1*10^{21}$ cm$^{-3}$.

6. The method of manufacturing the semiconductor device according to claim 1, wherein
in step (b) forming the two channel layers with a doping concentration between $1*10^{16}$ and $1*10^{18}$ cm$^{-3}$.

7. The method of manufacturing the semiconductor device according to claim 1, wherein
in step (c) forming the plug with a doping concentration between $2*10^{17}$ and $2*10^{21}$ cm$^{-3}$.

8. The method of manufacturing the semiconductor device according to claim 1, wherein in step (b) forming the at least one well layer and the two channel layers as a common layer having a low doping concentration at the first side in a region lateral to the source regions, and the doping concentration then rising to a higher doping concentration underneath the source regions.

9. The method of manufacturing the semiconductor device according to claim 2, wherein in said forming the plug with a doping concentration, which is between 10 times and 100 times higher than the doping concentration of the at least one well layer.

10. The method of manufacturing the semiconductor device according to claim 1, wherein said in step (b) forming the at least one well layer (5, 5') with a doping concentration which is between 10 times and 100 times higher than the doping concentration of the two channel layers (4, 4').

11. The method of manufacturing the semiconductor device according to claim 1, wherein in said step (b) forming the at least one well layer with a doping concentration between $1*10^{18}$ and $1*10^{20}$ cm$^{-3}$.

12. The method of manufacturing the semiconductor device according to claim 1, wherein in said step (c) forming the plug with a doping concentration between between $1*10^{19}$ and $2*10^{21}$ cm$^{-3}$.

13. A wide bandgap semiconductor device comprising a lowly doped drift layer of a first conductivity type between a first main side and a second main side of the device opposite to the first main side,
further comprising on the first main side two source regions of the first conductivity type having a source region depth, which two source regions have higher doping concentration than the drift layer,
two channel layers of a second conductivity type, which is different from the first conductivity type, having a channel layer depth, which is at least as great as the source region depth, wherein each source region is separated from the drift layer by a channel layer in a direction parallel to the first main side, and
two well layers of the second conductivity type having a well layer depth, which is at least as large as the channel layer depth, wherein the well layers have a higher doping concentration than the channel layers and wherein the well layers separate the two source regions from the drift layer on a side of the well layers opposite to the first main side,
a plug of the second conductivity type having a plug depth, which is at least as great as the well layer depth, and having a higher doping concentration than the well layers, wherein the plug is arranged between the two source regions, wherein the two well layers surround the plug in the lateral direction and the two well layers separate the plug from the two source regions two gate electrodes, each of which is arranged on the first main side, wherein each gate electrode comprises a gate layer, which is separated from any doped layer by a first insulating layer, and a first main electrode as an ohmic contact on the first main side, which at least contacts the two source regions and the plug.

14. The wide bandgap semiconductor device according to claim 13, wherein the two source regions the channel layers, the well layers and the plug form one planar plane on the first main side.

15. The wide bandgap semiconductor device according to claim 13, wherein the doping concentration of the plug is at least 10 times higher than the doping concentration of the well layers.

16. The wide bandgap semiconductor device according to claim 13, wherein the doping concentration of the well layers is at least 10 times higher than the doping concentration of the channel layers.

17. The wide bandgap semiconductor device according to claim 13, wherein at least one of the following are satisfied the plug has a doping concentration between $2*10^{17}$ and $2*10^{21}$ cm$^{-3}$, the well layers have a doping concentration between $1*10^{17}$ and $1*10^{21}$ cm$^{-3}$ and the channel layers have a doping concentration between $1*10^{16}$ and $1*10^{18}$ cm$^{-3}$.

18. The wide bandgap semiconductor device according to claim 13, wherein the well layers and the channel layers being formed as common layers having a low doping concentration at the first main side in a region lateral to the source regions, and the doping concentration then rising to a higher doping concentration underneath the source regions.

19. The wide bandgap semiconductor device according to claim 13, wherein the device is an insulated gate bipolar transistor or a metal-oxide semiconductor field-effect transistor.

20. The wide bandgap semiconductor device according to claim 13, wherein the doping concentration of the plug is between 10 times and 100 times higher than the doping concentration of the well layers (5, 5').

* * * * *